United States Patent [19]

Takada

[11] Patent Number: 4,950,921

[45] Date of Patent: Aug. 21, 1990

[54] SEMICONDUCTOR INTEGRATED CIRCUIT HAVING A BUILT-IN VOLTAGE GENERATOR FOR TESTING AT DIFFERENT POWER SUPPLY VOLTAGES

[75] Inventor: Masahide Takada, Tokyo, Japan

[73] Assignee: NEC Corporation, Japan

[21] Appl. No.: 237,043

[22] Filed: Aug. 26, 1988

[30] Foreign Application Priority Data

Aug. 26, 1987 [JP] Japan ................................ 62-213395

[51] Int. Cl.⁵ ......................... H03K 3/01; H03K 5/153
[52] U.S. Cl. .................................. 307/296.1; 307/358; 307/360
[58] Field of Search ...................... 307/296.1, 363, 362, 307/360, 361, 358

[56] References Cited

U.S. PATENT DOCUMENTS

| | | | |
|---|---|---|---|
| 4,709,165 | 11/1987 | Higuchi et al. | 307/350 |
| 4,709,172 | 11/1987 | Williams | 307/350 |
| 4,806,788 | 2/1989 | Tobita | 307/584 |
| 4,812,680 | 3/1989 | Kawashima et al. | 307/350 |
| 4,825,018 | 4/1989 | Okada et al. | 307/358 |

OTHER PUBLICATIONS

"The World of Silicon: Its Dog Eat Dog", IEEE Spectrum, Sep. 1988, pp. 30–39, by Brian Santo et al.
"Chip Voltage: Why Less is Better", IEEE Spectrum, Apr. 1987, Sunlen ehou et al.

Primary Examiner—Stanley D. Miller
Assistant Examiner—Richard Roseen
Attorney, Agent, or Firm—Laff, Whitesel, Conte & Saret

[57] ABSTRACT

An integrated circuit provided with a test scheme for allowing a control of the voltage applied to internal circuit elements is disclosed and includes a functional circuit, an internal voltage generator generating an internal operating voltage for the functional circuit from an externally applied power voltage, a switch for selectively applying the externally applied power voltage to the functional circuit, and a control circuit for controlling the switch.

7 Claims, 5 Drawing Sheets

SEMICONDUCTOR INTEGRATED CIRCUIT HAVING A BUILT-IN VOLTAGE GENERATOR FOR TESTING AT DIFFERENT POWER SUPPLY VOLTAGES

BACKGROUND OF THE INVENTION

1. Field of the Invention

The present invention relates to a semiconductor integrated circuit and, more particularly, to a semiconductor integrated circuit having a voltage generator generating an internal power voltage lower than an externally applied power voltage.

2. Description of the Related Art

Integration scale of semiconductor integrated circuits has been increased by reducing sizes of circuit elements such as transistors formed therein, and as a result of such reduction in sizes of circuit elements, large scale integrated circuits (LSI) and very large scale integrated circuit (VLSI) have been realized. For example, sizes of MOS field effect transistors, particularly channel length of MOS transistors in MOS dynamic memories (DRAMs) has been reduced in accordance with the increase of the memory capacities. For example, in the case of prototype 4 M-bit DRAMs which are recently announced by DRAM manufactures, MOS transistors having the channel length of 1 micron or less are employed.

However, if the MOS transistors having such short channel length as 1 micron or less are supplied with a conventional power voltage of 5 volts, the characteristics of the short-channel MOS transistors are likely to be degraded due to hot carriers. To prevent such degradation, so-called short-channel effect must be taken into consideration in designing ICs. For avoiding the troublesome consideration for the short-channel effect, it is desirable to employ a power voltage lower than 5 volts for driving the short-channel MOS transistors. In view of interface with the system outside the DRAMs and simplification of power voltage source, however, it is still advantageous to employ the conventional power voltage of 5 volts in common.

Under the above circumstance, it has been known to provide a voltage generator generating a power voltage lower than 5 volts from the conventional 5 volts power voltage in the same DRAM chip for driving memory section in which the short-channel MOS transistors are used. Thus, with keeping the unification of the power voltage with the peripheral system, the problems due to the short channel length of MOS transistors can be effectively solved by the proposal of using the internal voltage generator.

An example of the 4 M-bit DRAM employing the proposed internal voltage generator is shown in an article "*A 4Mb DRAM with Half Internal-Voltage Bitline Precharge*" 1986 IEEE International Solid-State Circuit Conference pp. 270–271.

In order to evaluate reliability of semiconductor integrated circuits such as DRAMS, the so-called acceleration test has been widely employed. The acceleration test is a test performed in a condition in which the power voltage and the atmospheric temperature are raised above the usual operating voltage (e.g. 5 volts) and the usual operating temperature (e.g. $-10°$ C. to $80°$ C.), respectively. Under such accelerated condition, the semiconductor integrated circuits are laid under an operating condition for a certain period of time. Namely, the semiconductor memory circuits to be tested are laid under such sever operating condition that the faulty factors of the semiconductor integrated circuits are actualized in a short time period. Thus, the reliability can be examined in a short time period.

However, it is difficult to achieve the acceleration test for the semiconductor integrated circuit using the internal voltage generator. This is because the internal voltage generator generates the constant internal voltage irrespective of the power voltage applied thereto for the acceleration test. It is, therefore, impossible to raise the internal voltage applied to the short-channel MOS transistors in the integrated circuit to be tested. Thus, the usage of the internal voltage generator has a great problem for performing the acceleration test.

SUMMARY OF THE INVENTION

It is an object of the present invention to provide a semiconductor integrated circuit having an internal or built-in voltage generator which generates a power voltage lower than an externaly applied power voltage for driving a part or whole of the semiconductor integrated circuit.

It is another object of the present invention to provide a semiconductor integrated circuit which uses short-channel MOS transistors but can be easily tested with increased power voltage.

The semiconductor integrated circuit according to the present invention comprises at least one functional circuit having a voltage node to receive a power voltage, an external voltage terminal for receiving an externally applied power voltage, an internal voltage generator coupled to the external voltage terminal for generating an internal voltage having a value lower than the externally applied power voltage, a circuit connection for applying the internal voltage to the voltage node, a switch means coupled between the external voltage terminal and the voltage node for controlling the connection therebetween and a means for controlling the on-off condition of the switch means. The controlling means may be a wiring applying a control signal to the switch means or may be a control signal generator generating the control signal in accordance with the externally applied power voltage.

According to the present invention, in the normal operation mode, the switching means separates the external voltage terminal from the voltage node so that the internal voltage is applied to the voltage node of the functional circuit from the internal voltage generator to make the functional circuit operate by the internal voltage, while in the test mode, the switching means directly connect between the external voltage terminal and the voltage node, so that the external power voltage is directly applied to the voltage node to make the functional circuit operate by the externally applied power voltage.

Thus, the semiconductor integrated circuit according to the present invention can be easily tested by the acceleration test.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Figure 1:
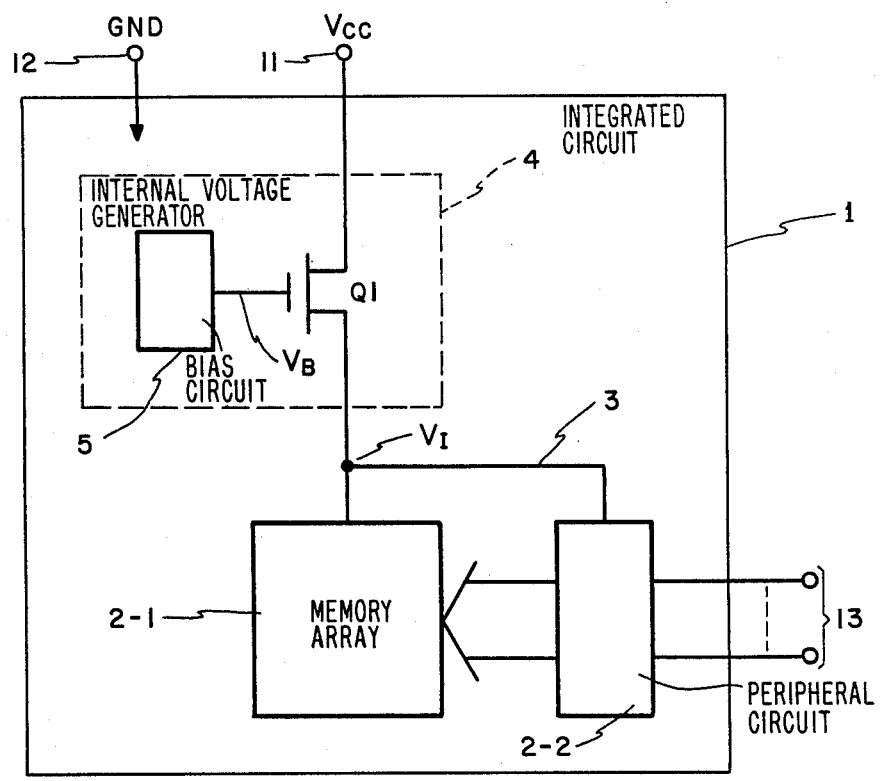
FIG. 1 is a schematic block diagram showing a semiconductor integrated circuit in the prior art.

With reference to FIG. 1, a conventional memory integrated circuit using an internal voltage generator will be explained.

The memory intergrated circuit 1 includes a memory array 2-1, a peripheral circuit 2—2 coupled to the memory array 2-1 and the external terminals 13 and an internal voltage generator 4 connected between a Vcc terminal 11 and an internal voltage line 3. The memory array 2-1 has a large number of memory cells and is typically a 4 M-bit array. MOS transistors in the array 2-1, particularly memory cell transistors, are formed in a minimum size or dimension to obtain a large integration of memory cells. For example, a channel length of those transistors is about 1 micron or less. Therefore, in order to avoid lowering of reliability of such short-channel transistors due to so-called short-channel effect, the memory array 2-1 and the peripheral circuit 2—2 are driven with an internal voltage $V_I$ generated from the internal voltage generator 4 in place of the power voltage Vcc externally applied through the terminal 11. Values of the internal voltage $V_I$ and the externally applied voltage Vcc are typically 3.5 and 5 volts, respectively. Although not shown explicity, the ground voltage GND applied through an external terminal 12 is applied to all of the array 2-1, the periheral circuit 2—2 and the internal voltage generator 4. The internal voltage generator 4 is formed of a field effect transistor $Q_1$ and a bias circuit 5 generating a bias voltage $V_B$ for the transistor $Q_1$. The bias voltage $V_B$ should be selected as a voltage lower than the externally applied voltage Vcc but higher than the ground potential GND. This bias voltage $V_B$ is applied to the gate of the transistor $Q_1$ to generate a constant voltage "$V_B-V_{TH}$" ($V_{TH}$ being a threshold voltage of $Q_1$) at a source of the transistor $Q_1$ or the internal voltage line 3 as an internal voltage $V_I$.

Figure 2:
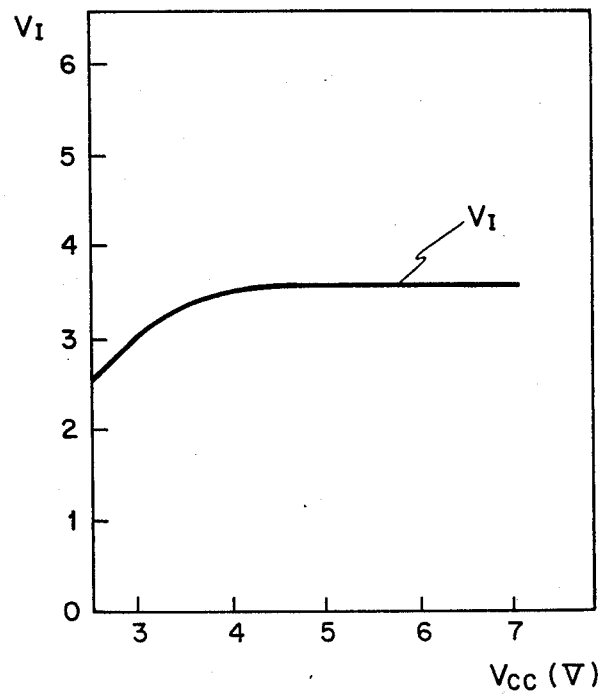
FIG. 2 is a graph showing a relationship between an externally applied power voltage and an internal power voltage in the circuit of FIG. 1.

FIG. 2 shows the input-output characteristics of the internal voltage generator 4. As is clear from FIG. 2, the value of the internal voltage $V_I$ is kept at a constant voltage of approximately 3 to 4 volts when the externally applied power voltage Vcc is more than 4 volts. Therefore, the internal circuits or blocks 2-1 and 2—2 operate with the constant internal voltage $V_I$ as far as the power voltage Vcc is of the usual value e.g. 5 volts or more than the usual value.

Thus, the circuit elements such as MOS transistors formed in the integrated circuit 1 can operate stably and reliably with the conventional power voltage supplying system.

To evaluate the reliability of the integrated circuits, a so-called acceleration test has been widely utilized. In order to perform the acceleration test, the voltage applied to the internal circuit, e.g. drains of MOS transistors is raised above the usual operating voltage. In the above-explained integrated circuit, however, it is difficult to raise the value of the internal voltage $V_I$ by raising the power voltage externally applied to the integrated circuit.

Thus, it has been difficult to perform the acceleration test for the integrated circuit using the internal voltage generator.

Figure 3:
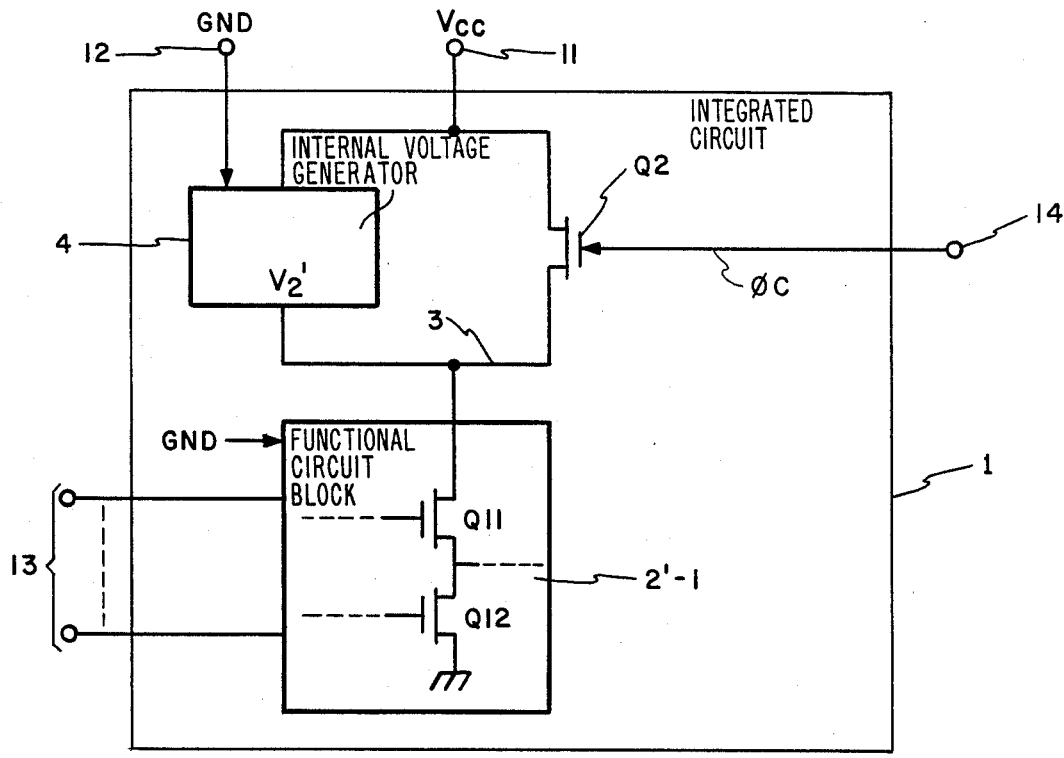
FIG. 3 is a schematic block diagram of an integrated circuit according to a first embodiment of the present invention.

Referring to FIG. 3, the integrated circuit according to a first embodiment is shown and will be next explained. In the following explanations, the circuits or elements corresponding to those in FIG. 1 are denoted by the same or similar references.

An integrated circuit shown in FIG. 3 is formed on a semiconductor chip 1 and includes a functional circuit block 2'-1 in which a plurality of field effect transistors such as $Q_{11}$, $Q_{12}$ having short channel length of 1 micron or less are formed, an internal voltage generator 4 connected to a power voltage (Vcc) terminal 11 and a ground voltage (GND) terminal 12 and a by-pass switch circuit made of a field effect transistor $Q_2$ connected between the power voltage terminal 11 and the internal voltage line 3, i.e. the output ($V_I$) of the voltage generator 4. A plurality of external terminals 13 are connected to the functional circuit 2'-1 for connecting with external system. The by-pass switch transistor $Q_2$ is controlled by a control signal $\phi_c$ which is applied through an external terminal 14. The terminal 14 is a terminal which is not connected to any functional circuits, such as NC (Non Connected) terminal.

In the normal operating mode, the control signal $\phi_c$ is at the inactive (low) level and therefore the by-pass switch transistor $Q_2$ is non-conductive. Thus, the functional circuit block 2'-1 is driven to operate in a predetermined function with the internal voltage ($V_I$) at the line 3 generated by the internal voltage generator 4 and the ground (GND) voltage. In a test mode, the control signal $\phi_c$ is made at the active (high) level so that the by-pass switch transistor $Q_2$ is conducting. Thus, a power voltage Vcc which is externally applied through the terminal 11 is directing applied to the functional circuit 2'-1 as an operating voltage thereof, so that the integrated circuit 1 may be subjected to the acceleration test by applying to the functional circuit block 2'-1 a high voltage (Vcc) suitable for the acceleration test.

Figure 4:
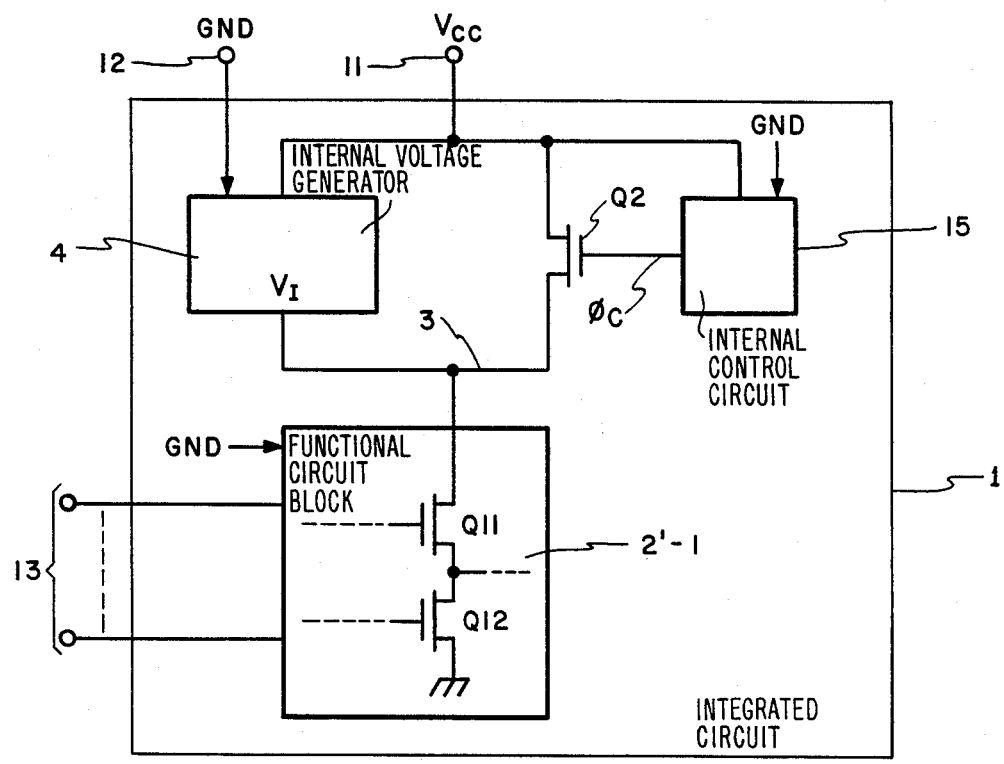
FIG. 4 is a schematic block diagram of an integrated circuit according to a second embodiment of the present invention.

Referring now to FIG. 4, an integrated circuit according to a second embodiment will be explained.

This embodiment is featured by an internal control circuit 15 driven by a power voltage Vcc through the power voltage terminal 11 and the ground voltage terminal 12. The internal control circuit 15 detects the voltage at the power voltage terminal 11 to generate the active level of the control signal $\phi_c$ turning on the transistor when the power voltage Vcc exceeds the normal value e.g. 5 volts and the inactive (low) level of the control signal $\phi_c$ turning off the transistor $Q_2$ when the power voltage Vcc is equal to or less than the normal value (e.g. 5 volts).

In the normal operating mode, the power voltage terminal Vcc is at the normal value e.g. 5 volts and hence the internal voltage $V_I$ generated by the internal voltage generator 4 is applied to the functional circuit block 2'-1 as the operating voltage thereto, because the by-pass switch field effect transistor $Q_2$ is the non-conducting state. In the test mode, the voltage higher than the normal value (e.g. 5 volts) is applied to the power voltage (Vcc) terminal 11, so that the by-pass switch transistor $Q_2$ is conducting. Thus, the power voltage Vcc is directly applied to the functional circuit block 2'-1 as the operating voltage therefor. Thus, the circuit elements, particularly the field effect transistors in the functional circuit block 2'-1 may be tested by the acceleration test technique.

According to this embodiment, the voltage applied to the functional circuit block 2'-1 can be automatically controlled without necessitating the external control terminal such as one 14 in FIG. 3.

Figure 5:
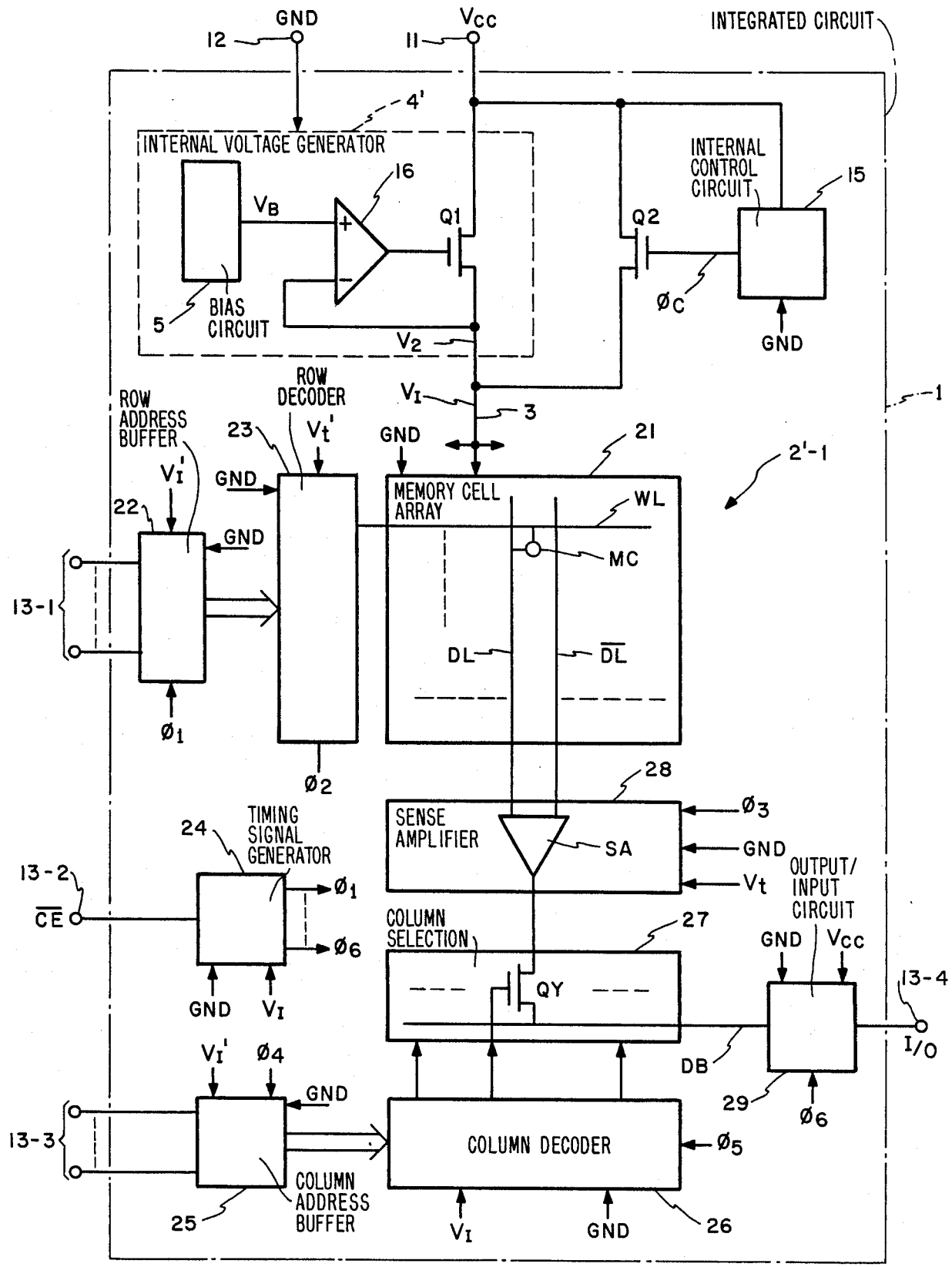
FIG. 5 is a schematic block diagram of a memory integrated circuit according to a third embodiment of the present invention.

Referrring to FIG. 5, a memory integrated circuit according to a third embodiment of the present invention is shown. This embodiment corresponds to the case where the functional circuit block 2'-1 of FIG. 4 is a memory circuit.

Namely, the memory circuit 2'-1 includes a memory cell array 21 having a plurality of memory cells MC, word lines and a plurality of pairs of digit lines DL and $\overline{DL}$ which are arranged in a known way, a row address buffer 22 coupled to row address terminals 13-1, a row decoder 22 for operatively selecting one of the word lines WL, a sense amplifier block 28 having a plurality of sense amplifiers SA each provided for each pair of digit lines DL and $\overline{DL}$, a column address buffer 25 coupled to column address terminals 13-3, a column selection circuit 27 having a plurality of selection transistors $Q_Y$ connected between a data line DB and the sense amplifiers SA, a column decoder 26 for selecting one of the selective transistors $Q_Y$, an output/input circuit 29, and a timing signal generator 24 receiving a chip enable signal $\overline{CE}$ through an external terminal 13-2 to generate timing signals $\phi_1$ to $\phi_6$. The timing signals $\phi_1$, $\phi_2$, $\phi_3$, $\phi_4$, $\phi_5$ and $\phi_6$ are used to enable the buffer 22, the row decoder 23, the sense amplifier block 28, the column address buffer 25, the column decoder 26 and the output/input circuit 29, respectively. Among the functional blocks of the memory circuit 2'-1, only the output/input circuit 29 operates with the externally applied power voltage Vcc and the ground voltage GND, while the other blocks, i.e. the buffer 22, the decoder 23, the timing signal generator 24, the column address buffer 25, the column decoder 26, the sense amplifier block 28 and the memory cell array 21 are formed of short-channel MOS transistors and are driven with the internal voltage $V_I$ supplied through the internal voltage line 3.

The internal voltage generator 4' includes an operational amplifier 16 having a non-inverting input terminal (+) receiving a bias voltage $V_B$, an inverting input terminal (−) connected to the internal voltage line 3 and an output terminal connected to the gate of the transistor $Q_1$. The operational amplifier 16 detects a voltage difference between the bias voltage $V_B$ and the voltage at the internal voltage line 3 to stabilize the internal voltage $V_I$ at the internal voltage line 3 irrespective of a change in current flowing through the line 3 or a change in the externally applied power voltage Vcc.

Figure 6:
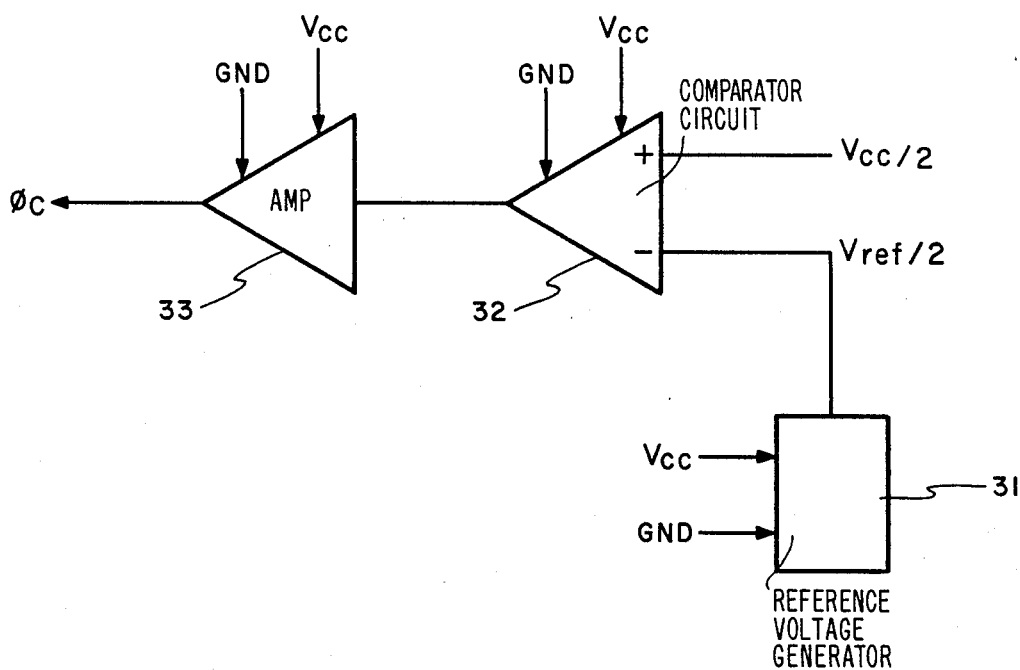
FIG. 6 is a schematic block diagram of a control circuit of FIG. 5.

An example of the control circuit 15 is shown in FIG. 6. The control circuit 15 includes a reference voltage generator 31 generating a reference voltage $V_{ref}/2$ ($V_{ref}$ is the usual value (e.g. 5 volts) of the externally applied power voltage Vcc), a comparator circuit 32 comparing a half value of the externally applied power voltage Vcc/2 with a half of the reference voltage $V_{ref}/2$, and a buffer circuit 33 for producing the control signal $\phi_c$. The circuits 31 to 33 operate with the externally applied power voltage Vcc and the ground voltage GND. When the half value of the power voltage Vcc/2 is equal to or less than the half value of the reference voltage $V_{ref}/2$ or, the output of the comparator circuit 32 is at the inactive (low) level to make the control signal $\phi_c$ at the inactive level.

To the contrary, when the half value of the externally applied power voltage Vcc/2 is above the half value of the reference voltage $V_{ref}/2$, the comparator circuit 32 produces the active (high) level as its output to make the control signal $\phi_c$ at the active (high) level. In this example, in place of comparing Vcc with $V_{ref}$, Vcc/2 is compared with $V_{ref}/2$ because the value of $V_{ref}$ is as high as 5 volts.

Figure 7:
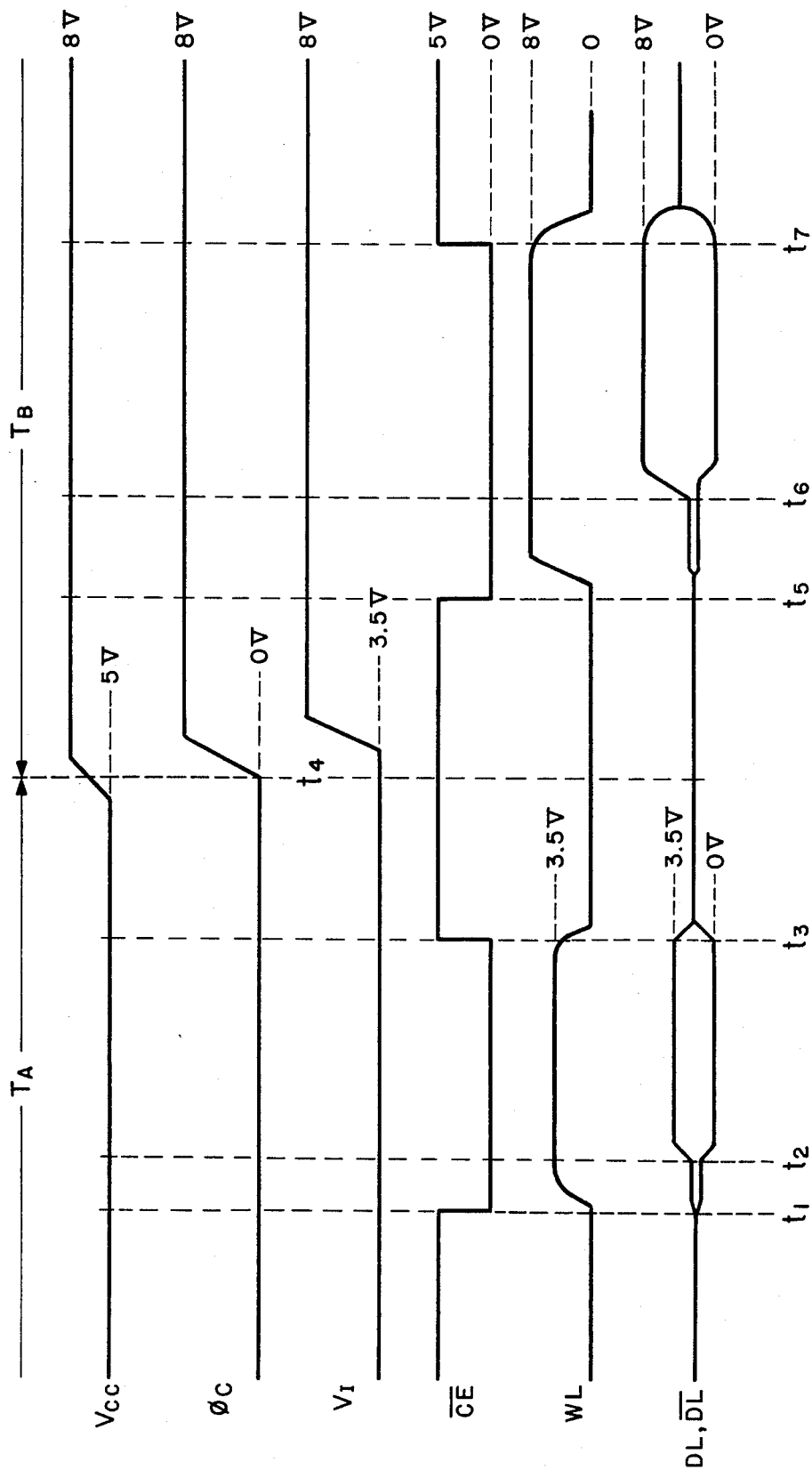
FIG. 7 is a timing diagram showing operations of the circuit of FIG. 5.

With reference to FIG. 7, operations of the memory integrated circuit of FIG. 5 will be explained. In a normal operating period TA, the power voltage Vcc is approximately at 5 volts and, therefore, the control signal $\phi_c$ is at the low or inactive level. Thus, the transistor $Q_2$ is non-conducting so that the internal voltage $V_I$ of approximately 3.5 volts is applied via the line 3 to the respective peripheral circuits 22–28 and the array 21. At a time point $t_1$, the chip enable signal $\overline{CE}$ is changed to the active (low) level from the inactive (high) level so that one of the word lines WL is selected by the row decoder in response to a timing signal $\phi_2$ and thereafter levels of each pair of digit lines DL and $\overline{DL}$ are amplified to the ground voltage and the internal voltage (3.5 volts) respectively by the sense amplifiers SA in response to a timing signal $\phi_3$ at a time point $t_3$. Then, at a time point $t_3$, the chip enable signal $\overline{CE}$ is changed to the inactive (high) level so that the timing signals $\phi_1$ to $\phi_6$ are all reset. As a result, one access operation is terminated.

At a time point $t_4$, the power voltage Vcc at the terminal 11 is raised to 8 volts which is above the usual operating value (5 volts), so that the control circuit 15 generates the active (high) level of the control signal $\phi_c$ to turn the transistor $Q_2$ conductive. As a result, the externally applied power voltage Vcc at this instance is directly applied to the internal line 3 as a power voltage. Thus, the test period $T_B$ is initiated. In this period $T_B$, the memory array 21 and all the peripheral circuits 22 to 29 are supplied with the raised value (8 volts) through the power terminal 11 and the ground voltage (GND) terminal 12. Thus, the circuit elements such as field effect transistors may be subjected to the accelerated condition of the power voltage Vcc. Then, at a time point $t_5$, the chip enable signal $\overline{CE}$ is changed to the active level, and then one of the word lines WL is selected and its potential is raised approximately to the Vcc (8 volts). As a result of the selection of the word line, a small potential difference is produced between the digit lines of each pair. Then at a time point $t_5$, the sense amplifiers SA are enabled in response to a timing signal $\phi_3$ so that the digit lines of each digit line pair are amplified to the level of the power voltage Vcc and the ground voltage, respectively. At a time point $t_7$, the chip enable signal $\overline{CE}$ is returned to the inactive level (high) so that the access operation under the accelerated condition is completed. Thus, for performing the acceleration test, the above-mentioned access operation is repeated under the high voltage (8 volts) of the power voltage Vcc during the period $T_B$.

As has been explained, the integrated circuit according to the present invention can be tested by the acceleration test method with ease. In the above explanations, the memory circuit is exemplified as the functional circuit, but the functional circuit may be any circuit such as logic circuit and so on.

I claim:

1. A semiconductor integrated circuit comprising a power voltage terminal for receiving an external voltage, at least one data terminal, an internal voltage line, an internal voltage generator coupled to said power voltage terminal and said internal voltage line, said internal voltage generator generating an internal voltage having a first value, said internal voltage appearing at said internal voltage line when a value of said external power voltage is larger than a second value, said second value being larger than said first value, a functional circuit coupled to said data terminal and said internal voltage line, said functional circuit operating with a power voltage supplied from said internal voltage line, a switching means coupled between said power voltage terminal and said internal voltage line for operatively providing a current path therebetween, a detection circuit coupled to said power voltage terminal for generating a detection signal when the value of said external power voltage is larger than a third value, said third value being larger than said second value, and a control circuit responsive to said detection circuit for controlling said switching circuit, said control circuit making said switching means conductive when said detection signal is present and non-conductive when said detection signal is not present.

2. The integrated circuit according to claim 1, in which said internal voltage generator includes a field effect transistor having a source-drain current path coupled between said power voltage terminal and said internal voltage line; and an operational amplifier having a non-inverting input terminal, an inverting input terminal and an output terminal; means for supplying a bias voltage to said non-inverting input terminal; means for coupling said internal voltage line to said inverting input terminal; and means for connecting said output terminal of said operational amplifier to a gate electrode of said first transistor.

3. The integrated circuit according to claim 1, in which said functional circuit includes at least one field effect transistor having a channel length of not over 1 micron and being coupled to said internal voltage line.

4. The integrated circuit according to claim 1, in which said funcational circuit includes a memory circuit coupled to said internal voltage line.

5. The integrated circuit according to claim 1, in which said switching means includes a field effect transistor having a source-drain current path coupled between said power voltage terminal and said internal voltage line.

6. The integrated circuit according to claim 1, in which said detection circuit includes a comparator having first and second input terminals, means for applying a first potential to said first input terminal, said first potential having said power voltage divided by a value of a predetermined factor, and means for applying a second potential to said second input terminal, said second potential having said third value of said power voltage divided by a value of said perdetermined factor.

7. The integrated circuit according to claim 6, in which said predetermined factor is 2.

* * * * *